United States Patent [19]

Stahlhofen et al.

[11] Patent Number: 4,786,581
[45] Date of Patent: Nov. 22, 1988

[54] GUMMING SOLUTION FOR USE IN THE BURNING-IN OF OFFSET-PRINTING PLATES COMPRISING WATER, A HYDROPHILIC POLYMER AND AN ORGANIC ACID DERIVATIVE

[75] Inventors: Paul Stahlhofen, Wiesbaden; Loni Schell, Hofheim-Wallau, both of Fed. Rep. of Germany

[73] Assignee: Hoechst Aktiengesellschaft, Fed. Rep. of Germany

[21] Appl. No.: 13,185

[22] Filed: Feb. 9, 1987

Related U.S. Application Data

[63] Continuation of Ser. No. 713,806, Mar. 20, 1985, abandoned.

[30] Foreign Application Priority Data

Mar. 22, 1984 [DE] Fed. Rep. of Germany ....... 3410522

[51] Int. Cl.$^4$ ............................................. G03C 5/18
[52] U.S. Cl. ................................... 430/331; 430/302; 430/309; 430/330; 524/132; 524/158; 524/295
[58] Field of Search ............... 430/331, 330, 302, 309; 524/295, 158, 132

[56] References Cited

U.S. PATENT DOCUMENTS

| 2,937,085 | 5/1960 | Seven et al. | 430/176 |
| 2,990,281 | 6/1961 | Printy et al. | 430/289 |
| 3,091,533 | 5/1963 | Hodgins | 430/331 |
| 3,201,241 | 8/1965 | Munder et al. | 430/331 |
| 3,745,011 | 7/1973 | Hudgin | 96/88 |
| 3,745,028 | 7/1973 | Rauner | 430/331 |
| 4,033,919 | 7/1977 | Lawson | 430/331 |
| 4,063,507 | 12/1977 | Toyama et al. | 101/467 |
| 4,191,570 | 10/1980 | Herting et al. | 430/302 |
| 4,233,198 | 11/1980 | Nölken | 524/132 |
| 4,265,999 | 3/1981 | Schell | 430/189 |
| 4,294,910 | 10/1981 | Wielinga | 430/302 |
| 4,355,096 | 10/1982 | Walls | 430/302 |
| 4,370,404 | 1/1983 | Tachikawa et al. | 430/331 |

FOREIGN PATENT DOCUMENTS 1555233 11/1979 United Kingdom .
1575200 9/1980 United Kingdom .

Primary Examiner—Paul R. Michl
Assistant Examiner—Patrick A. Doody
Attorney, Agent, or Firm—Foley & Lardner, Schwartz, Jeffery, Schwaab, Mack, Bluementhal & Evans

[57] ABSTRACT

A gumming solution is disclosed for use in the burning-in of irradiated and developed offset-printing plates. The gumming solution contains (a) water, (b) at least one hydrophilic polymer, and (c) at least one component derived from an organic acid. Component (b) comprises, for example, N-polyvinyl-pyrrolidone-(2) or polyacrylic acid, and component (c) comprises a water-soluble organic carboxylic acid, sulfonic acid, or phosphonic acid which has at least two acid functions and which is selected from the group consisting of benzene carboxylic acids, benzene sulfonic acids, benzene phosphonic acids, and alkane phosphonic acids, or one of the salts thereof (for example, disodium-benzene-1,3-disulfonate, mellitic acid, or methane-diphosphonic acid.) A process for the production of an offset-printing plate, using the aforesaid gumming solution in the burning-in of the plate, is also disclosed. With application of this gumming solution, washing of the printing plate prior to printing is rendered unnecessary, since the printing plate runs clean very rapidly during the printing process.

5 Claims, No Drawings

GUMMING SOLUTION FOR USE IN THE BURNING-IN OF OFFSET-PRINTING PLATES COMPRISING WATER, A HYDROPHILIC POLYMER AND AN ORGANIC ACID DERIVATIVE

This application is a continuation of application Ser. No. 713,806, filed Mar. 20, 1985 abandoned.

BACKGROUND OF THE INVENTION

The present invention is concerned with a gumming solution for use in the burning-in of irradiated and developed offset-printing plates, and with a process for offset printing plate production in which the aforesaid gumming solution is applied between the stages of developing and burning-in the printing plate.

Offset-printing plates usually comprise (a) a planar support material comprised of a metal and/or a plastic material, the surfaces of which can be modified, for example, by graining (etching) and/or by an anodic oxidation treatment, and (b) at least one radiation-sensitive (photosensitive) coating (reproduction layer). In the production of a printing plate, in which the basic operating steps include irradiation, development, and gumming (desensitizing), a burning-in step is additionally carried out between the last two steps, especially with positive-working reproduction layers, although burning-in is also possible with negative-working reproduction layers.

For positive-working reproduction layers, the procedure can be explained as follows: during the imagewise irradiation (exposure) step, those portions of the reproduction layer struck by electromagnetic energy (light) are rendered soluble, while the non-irradiated portions remain insoluble, relative to the developer which is to be used. By removing the irradiated portions of the layer in the developing step, the non-image areas, which are hydrophilic in the subsequent printing with the printing plate, appear on the printing plate surface, but the non-irradiated portions of the layer remain on the support and form the image areas which are ink-receptive in the subsequent printing process.

In practice, it has been found that heating of the irradiated and developed printing plate to a temperature exceeding 80° C., particularly to more than about 150° C., depending on the type of the support material and/or of the reproduction layer, with heat being applied either on the side of the reproduction layer or on the reverse side, can result in larger print runs obtained from the printing plate thus treated. This procedure is called "burning-in". By burning-in, curing of the image areas is achieved, to the extent that the image areas, for example, are rendered insoluble in the usual organic solvents and become resistant to the action of chemicals which may be present in the printing ink or in the dampening solution used in the subsequent printing process.

In the burning-in process, constituents of the image areas (i.e., of the reproduction layer), such as the binder constituents, can be deposited in the non-image areas, adversely influencing the hydrophilic character of these areas. This can result, for example, in scumming, i.e., the picking-up of printing ink by the non-image areas. In the initial phase of using a burning-in step, it has therefore been necessary to remove decontamination from the non-image areas by means of relatively caustic solutions. So-called "burning-in auxiliaries" have been developed which at least facilitate this post-cleaning operation. But as a rule, it has still been necessary to affect an additional cleaning of the non-image areas with water, before the actual printing process. Burning-in auxiliaries which are known to the art include the following:

In German Patent No. 2,318,286 (corresponding to U.S. Pat. No. 3,745,011), a process for the production of negative resist images is described in which a photoresist is exposed, developed and then treated with a solution of a cycloaliphatic, heterocyclic, or aromatic polycarboxylic acid, or with a solution of an aromic sulfonic acid, before carrying out a burning-in process. The photosensitive layers of the photoresists which are employed contain natural proteins, such as fish glue, and ammonium bichromate. This treatment before burning-in is intended to (a) lower the burning-in temperature, (b) increase the resistance of the resist image to etchants, and (c) improve the stripability of the resist image or of the applied photoresist, respectively. The acids that are used include, for example, p-toluene sulfonic acid, 2-naphthalene sulfonic acid, naphthalene-1,8-disulfonic acid, benzene sulfonic acid, and 1,3-benzene-disulfonic acid, and are preferably employed in the form 1% to 25% strength solutions. As the support material for coating with a photoresist, steel is exclusively used. Printing plates and the specific burning-in problems encountered in this field of application are not mentioned in this publication.

German Patent No. 2,530,422 (corresponding to British Published Application Ser. No. 1,513,368) disclosed a process for manufacturing printing plates, boards for printed circuits, integrated circuits and the like. In the process, the exposed and developed supports are provided with a protective layer which is applied at least to the non-image areas before burning-in. During burning-in, this protective layer remains on the support and can be removed with water after burning-in, together with a deposit which has settled on the protective layers in the burning-in process. The protective layer is applied as an aqueous solution about 2.5% to 45% strength of one of the following compounds: sodium dodecyl phenoxy benzene disulfonate, a sodium salt of an alkylated naphthalene sulfonic acid, a disodium salt of methylene di-(naphthalene sulfonic acid), sodium dodecyl benzene sulfonate, a sodium salt of a sulfonated alkyldiphenyl oxide, ammonium perfluoroalkyl sulfonate, potassium perfluoroalkyl sulfonate, sodium dioctyl sulfosuccinate, sodium-di(methylamyl)-sulfosuccinate, and $LiNO_3$.

In British Published Application No. 1,575,200, which is based on the above-mentioned German patent publication, the aqueous solution used to form the protective layer is, before burning-in, admixed with a water-soluble hydrocolloid selected from the group consisting of gum arabic, sodium carboxymethyl cellulose, and alginate, in addition to one of the above-indicated compounds. The composition employed should comprise from 85% to 98% by volume of one of the compounds disclosed in British Published Application No. 1,513,368 and from 2% to 15% by volume of one of the hydrocolloids and is used in the form of a 10% to 50% by volume strength aqueous solution. After burning-in, the printing plates are washed with water and can then be mounted in a printing machine. The disclosed composition could be designated either a "gumming solution for burning-in" or a "desensitizing agent for burning-in", since it acts as a "burning-in auxiliary" and also as a "gumming solution".

The burning-in auxiliary according to German Patent No. 2,625,336 (corresponding to U.S. Pat. No.

4,063,507) comprises boric acid or a borate, and is used in a solid form or, preferably, as a 3% to 10% strength aqueous solution. According to German Offenlegungsschrift No. 2,626,473 (corresponding to British Published Application No. 1,555,233), it is also possible to use, among others, various hydrophilic polymers, such as gum arabic, dextrin, polyvinyl alcohol, cellulose ethers, homopolymers and copolymers based on acrylic acid or methacrylic acid, a copolymer of alkyl acrylate and vinyl methyl acetamide, and even salt of organic acids, for example, the sodium salt of anthraquinone-2,7-disulfonic acid, the sodium salt of naphthalene-1,3,5-trisulfonic acid, the sodium salt of 1-naphthylamine-4,6,8-trisulfonic acid, and the sodium salt of 1-naphthol-3,6-8-trisulfonic acid, in lieu of the compounds (burning-in auxiliaries) which have been described above as being suitable for use in the burning-in of printing plates. The compounds are used in aqueous solutions at concentrations ranging from 0.1% up to saturation.

As further burning-in auxiliaries, carboxyl-group containing amines, for example, ethylene diamine tetraacetic acid, nitrilo triacetic acid and the salts thereof, are specified in European Patent Application No. 0,043,991 (corresponding to U.S. Pat. No. 4,355,096), and salts or salt-like reaction products of naphthalene, formaldehyde and sulfuric acid are mentioned in U.S. Pat. No. 4,191,570.

All burning-in auxiliaries which are known in the art still present disadvantages. They can, for example, cause a reduction in the oleophilic properties of the image areas, lead to staining on the printing-plate surface and, particularly with insufficient post-cleaning with water or aqueous developer solutions, the production of irregularities in the water/ink balance in the subsequent printing process. In many descriptions concerning the use of known burning-in auxiliaries, attention is specifically drawn to these problems, which are mentioned as being solvable, for example, by rubbing dry the printing-plate surface before burning-in, by thoroughly rewashing, or even by carrying out a hydrophilizing post-treatment/cleaning using an aqueous solution of a hydrophilic polymer like polyvinyl phosphonic acid [see, for example, European Patent Application No. 0,012,956 (corresponding to U.S. Pat. No. 4,265,999)].

Special hydrophilizing post-treatments of this kind, and even one of the customary gumming (desensitizing) post-treatments, are feasible, but they require an additional working step in the production and use of a printing plate. A combination of the two steps in a single burning-in and gumming treatment is described in the above-mentioned British Published Application No. 1,575,200. This treatment still results in a high consumption of paper in the printing machine, however, since without additional, intermediate cleaning the printing plate takes too long to run clean (see also the comparative examples described below).

SUMMARY OF THE INVENTION

It is therefore an object of the present invention to provide a gumming solution, for use in the burning-in of offset-printing plates, which does not have to be washed off after burning-in from a printing plate treated with the gumming solution.

It is another object of the present invention to provide a gumming solution which permits an offset-printing plate to run clean very rapidly upon printing and which has a good storability (or possesses gumming action that does not have to be renewed), even after a prolonged storage time.

It is yet another object of the present invention to provide a process for producing an offset-printing plate which can be used immediately in a printing machine, and subjected to a conventional printing operation, without an additional washing step or the production of more than a few discards before a perfect print is obtained.

In accomplishing the foregoing objects, there has been provided, in accordance with one aspect of the present invention, a gumming solution for use in the burning-in of irradiated and developed offset-printing plates, comprising in admixture (a) water, (b) at least one hydrophilic polymer and (c) at least one component selected from the group consisting of water-soluble organic acids comprising at least two acid functions and being selected from the group consisting of a benzene carboxylic acid, a benzene sulfonic acid, a benzene phosphonic acid, an alkane phosphonic acid, and water-soluble salts thereof.

In accordance with another aspect of the present invention, there has been provided a process for the production of an offset-printing plate, comprising the steps of irradiating, developing, and burning-in an offset-printing plate, and further comprising, after the developing step but before the burning-in step, the step of treating the offset-printing plate with an aqueous solution which comprises, in admixture, water, at least one hydrophilic polymer, and at least one component derived from an organic acid as described above.

Other objects, features, and advantages of the present invention will become apparent from the following detailed description. It should be understood however, that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF PREFERRED EMBODIMENTS

The above-mentioned components (b) and (c), which are dissolved in the aqueous solution in accordance with the present invention, are such that they do not evaporate at the customary burning-in temperatures. The protective layer which is formed remains water-soluble, even after burning-in, and can readily be removed without damaging the printing plate.

In the application of the gumming solution of the present invention, the surface (or, in the case of a double-sided coating with a reproduction layer, the two surfaces) of the irradiated and developed offset-printing plate are rubbed with a pad impregnated with the gumming solution. Other methods of application, such as dipping, spraying, spin-coating and pouring-on, are also possible, and application can be effected by hand or in automatic processing machines as well. Appropriately, the surface of the printing plate provided with the gumming solution of the present invention is dried before burning-in. But, it is also possible to dry the solution during the following burning-in process. After drying, the gumming solution generally yields a layer weight in the range from 0.05 to 20 g/m².

A printing plate treated in this manner is then heated in a burning-in oven at a temperature in the range from 80° about to 300° C., particularly from 150° to 270° C., at heating times which normally range from 0.5 to 10 minutes. In addition to treatment in conventional air-ovens, other treatments have recently been described, for example, irradiation by quartz-halogen lamps, according to German Patent No. 1,955,378; by a infrared-radiation source, according to German Patent No. 2,201,936; and by ultraviolet lamps, according to German Offenlegungsschrift No. 3,110,632.

Component (b) comprises, in particular, the following hydrophilic polymers: N-polyvinyl-pyrrolicone-(2), polyvinyl methylether, copolymers containing ethylene units and maleic anhydride units, homopolymers or copolymers containing vinyl phosphonic acid units, vinyl methyl phosphinic acid units and/or acrylic acid units and/or a polyalkylene glycol, such as polyethylene glycol. Component (c) comprises, in particular, benzene disulfonic acids, benzene polycarboxylic acids having from 3 to 6 carboxyl groups, alkane diphosphonic acids which having from 1 to 3 carbon atoms in the alkane group, carboxyl group-containing alkane diphosphonic acids which have from 5 to 9 carbon atoms in the alkane group, and/or one of the water-soluble salts of these acids (preferably alkali metal salts or ammonium salts). Examples of the last-mentioned compounds include benzene-1,3-disulfonic acid, benzene-1,2,4-tricarboxylic acid (trimellitic acid), benzene-1,2,4,5-tetracarboxylic acid (pyromellitic acid), benzene hexacarboxylic acid (mellitic acid), methane diphosphonic acid (diphosphonomethane), 4,4-diphosphono-heptane-1,7-dioic acid (3,3-diphosphone-pimeic acid), and the sodium salts of these acids. The gumming solution according to the present invention generally contains from 1 to 50%, preferably from 3 to 30%, of the sum of components (b) and (c). These components are particularly present in a weight ratio (b):(c) ranging from 1:1 to 1:20.

In other embodiments of the present invention, the gumming solution for use in the burning-in process can additionally contain hydroxy-polycarboxylic acids, such as citric acid and/or the salts thereof, in a proportion from 0.1 to 5%; water-soluble alkanediols having at least 4 carbon atoms, such as hexanediol-(1,6), in a proportion from 0.1 to 5%; and surfactants (preferably anionic or non-ionic surfactants), such as alkylaryl sulfonates (e.g., disodium-diisobutyl-naphthalene-disulfonate), alkylphenol-ether sulfonates (e.g., disodium-dodecyl-diphenylether-disulfonate) and a natural surfactant (e.g., saponin), in a proportion from 0.005 to 5%.

The gumming solution according to the present invention can be used to treat conventional offset-printing plates comprising a support comprised of a metal and/or a temperature-stable plastic. The solution is, however, particularly suitable for use with offset-printing plates which have a mechanically, chemically and/or electrochemically roughened and, optionally, anodically oxidized support comprised of aluminum or an aluminum alloy. These support materials can be coated with negative-working or positive-working reproduction layers comprising one of the radiation-sensitive compounds known in the art, for example, diazo compounds, diazonium compounds, axido compounds, and photopolymerizable compounds [see, e.g., Jaromir Kosar, *Light-Sensitive Systems* (John Wiley & Sons, New York) 1965].

The gumming solution according to the present invention is particularly suitable for use in the burning-in of positive-working reproduction layers which contain, in addition to the actual radiation-sensitive compound, resins, particularly novolaks or resols, and various other components, such as dyes, adhesion promoters and levelling agents. The radiation-sensitive compounds contained in such positive-working reproduction layers, include, in particular, o-quinone diazides, preferably o-naphthoquinone diazides, such as naphthoquinone-(1,2)-diazide-(2)-sulfonic acid esters and amides, which may have low or relatively high molecular weights, as described, for example, in German Patent Nos. 854,890; 865,109; 879,203; 894,959; 938,233; 1,109,521; 1,144,705; 1,118606; 1,120,273; 1,124,817; and 2,331,377 and in European Patent Application Nos. 0,021,428 and 0.055,814.

The gumming solution and the burning-in gumming process of the present invention possess an advantage associated with conventional burning-in auxiliaries, namely, that any contamination in the non-image areas of offset-printing plates is easily removable. In addition, the processing steps of washing off the applied protective layer and/or of applying or renewing a gumming (desensitizing) coating are rendered superfluous by the present invention. A printing plate treated, in accordance with the present invention, with the above-described gumming solution for use in the burning-in process runs clean after a surprisingly short time in the printing machine, and is characterized by a rapid acceptance of ink by the image areas and, at the same time, by non-image areas which remain free from scumming.

In the above description and the following examples, percentages denote percent by weight, unless otherwise indicated; parts by weight and parts by volume are related as g:cm$^3$.

Example 1

A positive-working radiation-sensitive mixture was prepared which had the following composition:

- 1.00 part by weight of the condensation product of 2,3,4-trihydroxybenzophenone and naphthoquinone-(1,2)-diazide-(2)-5-sulfonic acid chloride,
- 0.60 part by weight of the condensation product of 1 mole of 2,2'-dihydroxy-1,1'-dinaphthyl methane and 2 moles naphthoquinone-(1,2)-diazide-(2)-5-sulfonic acid chloride,
- 6.60 parts by weight of a novolak prepared by condensing a technical grade cresol mixture with formaldehyde, having a softening point in the range from 108° to 118° C.,
- 0.08 part by weight of crystal violet,
- 0.06 part by weight of Sudan Yellow GGN, in
- 100.00 parts by volume of ethylene glycol monomethyl ether.

The mixture was coated upon a mechanically roughened aluminum foil, using a rotating support to whirl off the excess quantity of the applied mixture. After coating, the foil was dried, first in a warm stream of air and thereafter at a temperature of 100° C., for about 5 minutes. The resulting offset-printing plate, in which the reproduction layer had a weight of 2.30 g/m$^2$, was imagewise exposed under a transparent positive original and then developed with the following solution:

- 5.3 parts by weight of Na$_2$SiO$_3$·9H$_2$O
- 3.4 parts by weight of Na$_3$PO$_4$·12H$_2$O
- 0.3 part by weight of NaH$_2$PO$_4$ anhydrous, in
- 91.0 parts by weight of H$_2$O.

Due to the developing, portions of the reproduction layer which had been struck by light were removed and the unexposed portions remained on the support material, forming the image areas, resulting in a a printing stencil corresponding to the original.

When a printing plate produced in this manner was used in a printing machine, about 50,000 perfect prints were obtained. In order to attain a multiple of this number of printed copies, the printing plate as burned-in. For this purpose, the exposed and developed printing plate was wiped over with a pad impregnated with the following solution and rubbed dry in such a fashion that a contiguous film was formed over the entire surface of the printing plate:

2.00 parts by weight of N-polyvinyl pyrrolidone-(2),
10.00 parts by weight of Na-benzene-1,3-disulfonate,
4.00 parts by weight of tripotassium citrate·H₂O
1.10 parts by weight of citric acid·H₂O,
1.50 parts by weight of hexanediol-(1,6),
81.40 parts by weight of distilled H₂O.

The printing plate coated with the protective layer was then burned-in, for 5 minutes at 240° C., in a commercial air oven. The resulting printing plate could immediately be mounted in a printing machine and subjected to the usual printing operation, i.e., it was not necessary to remove the protective layer with water before printing or to treat the printing plate again with a desensitizing agent, such as gum arabic. After only 6 to 7 revolutions of the dampening and inking roller of the printing machine, the printing stencil completely accepted ink while, at the same time, the background was free from scumming, such that a perfect print was obtained after printing at most 10 sheets of paper ("discards").

A presensitized offset-printing plate produced corresponding to Example 1 was treated, under identical processing conditions, with an aqueous solution containing 7% of gum arabic and 22% of disodium-dodecyl-phenoxybenzene disulfonate, according to Example 1 of British Patent No. 1,575,200, before burning-in. The printing plate thus pretreated was burned-in and mounted in a printing machine, without washing off the protective layer, and a perfect proof was not obtained even after printing 100 discards. A similarly unsatisfactory result was obtained when sodium carboxymethyl cellulose was used instead of gum arabic.

Similarly, printing plates manufactured according to German Offenlegungsschrift No. 2,626,473 and German Patent No. 2,625,336, using, for example, Na₂B₄O₇ or Na₂HOP₄ as burning-in auxiliaries, were incapable of producing perfect proofs when the corresponding protective layers were not washed off with water before the actual printing operation.

The burned-in printing plate which had been treated with the gumming solution of the present invention could even be stored over a period of several months at room temperature without problems arising, for example, scumming occurring in the non-image areas, in a subsequent printing operation.

Examples 2 to 5

In the following examples, additional gumming solutions for use in the burning-in process of the present invention were used to treat printing plates produced according to Example 1 above, prior to burning-in. Similarly to Example 1, perfect prints were obtained after a relatively short time in the printing machine. Unless specifically mentioned, production and processing of the printing plates obtained with these solutions corresponded to the conditions described in Example 1.

Example 2

The following gumming solution for use in burning-in was applied:
1.50 parts by weight of polyvinyl methyl ether,
3.00 parts by weight of 3,3-diphosphonopimelic acid
7.00 parts by weight of disodium-benzene-1,3-disulfonate,
4.00 parts by weight of tripotassium citrate·H₂O,
1.10 parts by weight of citric acid·H₂O,
1.50 parts by weight of hexane diol-(1,6),
0.05 part by weight of an anionic surfactant (sodium salt of 1,2-isopropylnaphthalene sulfonic acid),
81.00 parts by weight of distilled H₂O.

Example 3

The following gumming solution for use in burning-in was applied:
1.50 parts by weight of a 40% strength aqueous solution of a polyacrylic acid a molecular weight below 150,000 and a pH value of 2±0.5,
80.50 parts by weight of distilled H₂O,
4.00 parts by weight of tripotassium citrate·H₂O,
1.10 parts by weight of citric acid·H₂O,
1.50 parts by weight of hexanediol-(1,6),
10.00 parts by weight of disodium-benzene-1,3-disulfonate,
1.00 parts by weight of an anionic surfactant I (sodium-olefinsulfonate),
0.30 part by weight of an anionic surfactant II (alkylbenzenesulfonate).

Example 4

The following gumming solution for use in burning-in was applied:
2.00 parts by weight of polyvinyl phosphonic acid,
10.00 parts by weight of pyromellitic acid,
4.00 parts by weight of tripotassium citrate·H₂O,
1.10 parts by weight of citric acid·H₂O,
1.50 parts by weight of hexanediol-(1,6),
0.05 part by weight of an anionic surfactant (see Example 2), and
81.30 parts by weight of distilled H₂O.

Example 5

The following gumming solution for use in burning-in was applied:
1.5 parts by weight of polyvinylmethylphosphinic acid,
12.0 parts by weight of disodium-benzene-1,3-disulfonate,
85.5 parts by weight of distilled H₂O.

What is claimed is:

1. A solution for use in the burning-in of irradiated and developed offset-printing plates, consisting essentially of an admixture of (a) enough water to solubilize water-soluble components in said solution, (b) at least one water-soluble hydrophilic polymer selected from the group consisting of poly-N-vinyl-pyrrolidone-(2), polyvinyl methylether, a copolymer containing ethylene units and maleic anhydride units, a homopolymer or copolymer containing at least one from the group consisting of vinyl phosphonic acid units and vinyl methyl phosphinic acid units, and a polyalkylene glycol and (c) at least one component derived from an organic acid, wherein (i) said component (c) comprises at least one water-soluble organic acid comprising at east two acid functions and being selected from the group consisting of a benzene carboxylic acid, a benzene sulfonic acid, a benzene phosphonic acid, and an alkane phosphonic acid, or a water-soluble salt thereof; (ii) about 1 to 50% by weight of said solution is comprised of components (b) and (c), which are present in a weight ratio ranging from about 1:1 to 1:20, and (iii) said solution is capable of producing, even after burning-in a totally water-soluble layer.

2. A solution as claimed in claim 1, wherein component (c) comprises at least one from the group consisting of a benzene disulfonic acid, a benzene polycarboxylic acid comprising from 3 to 6 carboxyl groups, an alkane diphosphonic acid comprising an alkane group which contains from 1 to 3 carbon atoms, an alkane diphosphonic acid comprising an alkane group which comprises from 5 to 9 carbon atoms and which contains a carboxyl moiety, and a water-soluble salt thereof.

3. A solution as claimed in claim 2, wherein component (c) comprises at least one selected from the group consisting of benzene-1,3-disulfonic acid, benzene-1,2,4-tricarboxylic acid, benzene-1,2,4,5-tetracarboxylic acid, benzene hexacarboxylic acid, methane diphosphonic acid, 4,4-diphosphonoheptane-1,7-dioic acid, and a water-soluble salt thereof.

4. A solution as claimed in claim 1, further comprising a hydroxypolycarboxylic acid and/or a water-soluble salt thereof.

5. A solution as claimed in claim 1, further comprising a water-soluble alkanediol containing at least 4 carbon atoms.

* * * * *